(12) United States Patent
Ooneda

(10) Patent No.: US 9,460,781 B1
(45) Date of Patent: Oct. 4, 2016

(54) MEMORY SYSTEM AND MEMORY CONTROL METHOD

(71) Applicant: Kabushiki Kaisha Toshiba, Minato-ku (JP)

(72) Inventor: Taku Ooneda, Machida (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/844,182

(22) Filed: Sep. 3, 2015

Related U.S. Application Data

(60) Provisional application No. 62/130,932, filed on Mar. 10, 2015.

(51) Int. Cl.
 *G11C 29/52* (2006.01)
 *G11C 11/56* (2006.01)
 *G06F 11/10* (2006.01)

(52) U.S. Cl.
 CPC ....... *G11C 11/5635* (2013.01); *G06F 11/1068* (2013.01); *G06F 11/1072* (2013.01); *G11C 11/5642* (2013.01); *G11C 29/52* (2013.01)

(58) Field of Classification Search
 None
 See application file for complete search history.

(56) References Cited

U.S. PATENT DOCUMENTS

| 3,718,905 | A | * | 2/1973 | Tong | ..................... H04L 1/0059 714/787 |
|---|---|---|---|---|---|
| 8,631,302 | B2 | | 1/2014 | Radke | |
| 8,656,252 | B2 | | 2/2014 | So et al. | |
| 2014/0136923 | A1 | * | 5/2014 | Smith | ................... H03M 13/05 714/762 |
| 2014/0169091 | A1 | * | 6/2014 | Yao | ........................ G11C 29/04 365/185.09 |

FOREIGN PATENT DOCUMENTS

JP 3181452 7/2001

* cited by examiner

*Primary Examiner* — James G Norman
(74) *Attorney, Agent, or Firm* — Oblon, McClelland, Maier & Neustadt, L.L.P.

(57) ABSTRACT

According to one embodiment, a memory system includes a non-volatile memory, a memory interface, an encoder configured to generate eight code words, and a writing control unit. The writing control unit causes the memory interface to perform a first writing and a second writing, and repeat the first writing and the second writing. The first writing writes a first symbol included in a first code word to a second page in a first word line. The second writing writes a second symbol included in a first code word to a first page in a third word line adjacent to a second word line adjacent to a first word line. Thus, the code words to be written are changed. The repeat of the first writing and the second writing is performed by shifting a word line at a write destination one by one.

19 Claims, 11 Drawing Sheets

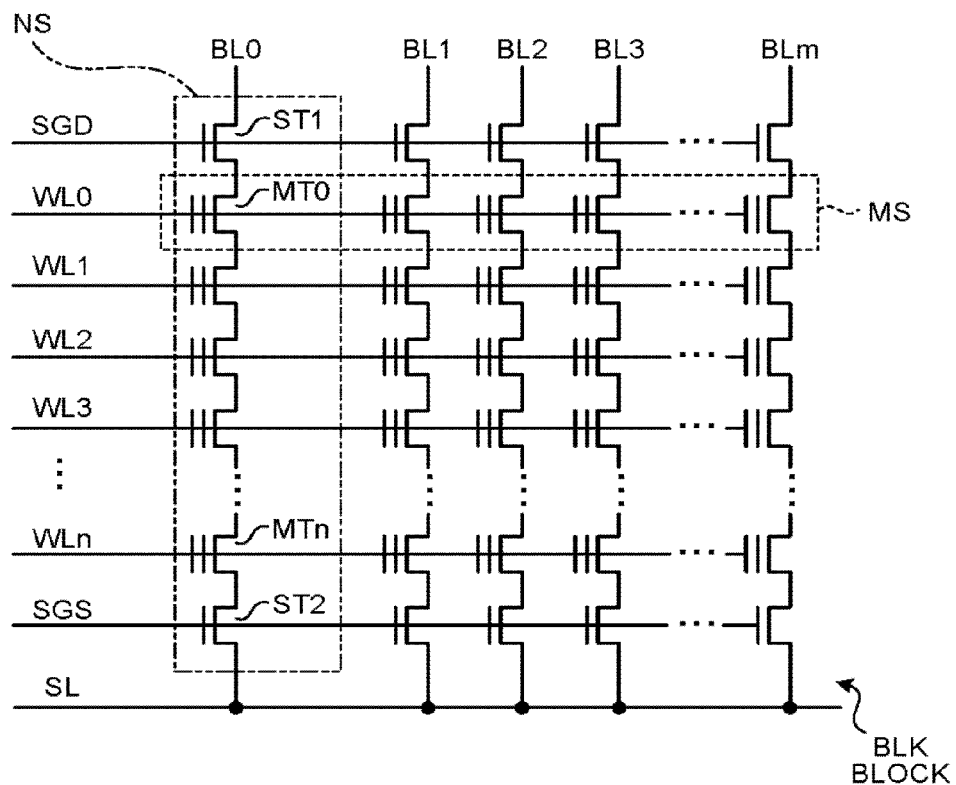

FIG.8

|  |  | pl0 | pl1 | pl2 | pl3 |
|---|---|---|---|---|---|
| WL0 | U | B (2) | B (2) | F (2) | F (2) |
|  | L | A (0) | A (0) | E (0) | E (0) |
| WL1 | U | C (4) | C (4) | G (4) | G (4) |
|  | L | A (1) | A (1) | E (1) | E (1) |
| WL2 | U | D (6) | D (6) | H (6) | H (6) |
|  | L | B (3) | B (3) | F (3) | F (3) |
| WL3 | U | A (8) | A (8) | E (8) | E (8) |
|  | L | C (5) | C (5) | G (5) | G (5) |
| WL4 | U | B (10) | B (10) | F (10) | F (10) |
|  | L | D (7) | D (7) | H (7) | H (7) |
| WL5 | U |  |  |  |  |
|  | L | A (9) | A (9) | E (9) | E (9) |

| | | pl0 | pl1 | pl2 | pl3 |
|---|---|---|---|---|---|
| WL0 | U | B (2) | B (2) | F (2) | F (2) |
| | L | A (0) | A (0) | E (0) | E (0) |
| WL1 | U | C (4) | C (4) | G (4) | G (4) |
| | L | A (1) | A (1) | E (1) | E (1) |
| WL2 | U | D (6) | D (6) | H (6) | H (6) |
| | L | B (3) | B (3) | F (3) | F (3) |
| WL3 | U | E (8) | E (8) | A (8) | A (8) |
| | L | C (5) | C (5) | G (5) | G (5) |
| WL4 | U | F (10) | F (10) | B (10) | B (10) |
| | L | D (7) | D (7) | H (7) | H (7) |
| WL5 | U | | | | |
| | L | E (9) | E (9) | A (9) | A (9) |

|  |  | pl0 | pl1 | pl2 | pl3 |
|---|---|---|---|---|---|
| WL0 | U | B (2) | B (2) | F (2) | F (2) |
|  | L | A (0) | A (0) | E (0) | E (0) |
| WL1 | U | C (4) | C (4) | G (4) | G (4) |
|  | L | A (1) | A (1) | E (1) | E (1) |
| WL2 | U | D (6) | D (6) | H (6) | H (6) |
|  | L | B (3) | B (3) | F (3) | F (3) |
| WL3 | U | A' (8) | A' (8) | E' (8) | E' (8) |
|  | L | C (5) | C (5) | G (5) | G (5) |
| WL4 | U | B' (10) | B' (10) | F' (10) | F' (10) |
|  | L | D (7) | D (7) | H (7) | H (7) |
| WL5 | U |  |  |  |  |
|  | L | A' (9) | A' (9) | E' (9) | E' (9) |

~200

MEMORY SYSTEM AND MEMORY CONTROL METHOD

CROSS-REFERENCE TO RELATED APPLICATIONS

This application is based upon and claims the benefit of priority from U.S. Provisional Application No. 62/130,932, filed on Mar. 10, 2015; the entire contents of which are incorporated herein by reference.

FIELD

Embodiments described herein relate generally to a memory system and a memory control method.

BACKGROUND

A storage using a NAND flash memory (NAND memory) perform an Error Check and Correct. The storage codes data to be written to the NAND memory and then writes the data to the NAND memory. Data is written to the NAND memory in a writing unit referred to as a page. Meanwhile, a method referred to as an inter-page ECC is available. The inter-page ECC distributes and writes one code word to a plurality of pages. The use of the inter-page ECC ensures restoring data even if a burst error, such as data erasure in units of pages, occurs.

BRIEF DESCRIPTION OF THE DRAWINGS

FIG. 5 is a drawing illustrating an exemplary configuration of a block in a non-volatile memory;
FIG. 6 is a drawing illustrating an exemplary order of writing to each page in the non-volatile memory;
FIG. 8 is a drawing illustrating an exemplary method for arranging the code words in four planes;
FIG. 9 is a drawing illustrating an exemplary code word arrangement different from FIG. 8, in the case where a count of Banks is one or in the case where even if the Banks are plural, one code word is not dispersedly arranged to the plurality of Banks;
FIG. 12 is a drawing illustrating an exemplary method for arranging the code words to dispersedly arrange one code word to two Banks.

DETAILED DESCRIPTION

In general, according to one embodiment, a memory system includes a non-volatile memory. The non-volatile memory includes four planes configured to ensure a parallel operation. The plane includes a plurality of word lines. A plurality of memory cells are coupled to the word line. The memory cell is a memory cell configured to store two bits of a first bit and a second bit. The first bit corresponds to a first page. The second bit corresponds to a second page. The memory system also includes a memory interface, an encoder configured to generate eight code words, and a control unit. The control unit is configured to cause the memory interface to perform a first writing, a second writing, a third writing, a fourth writing, and a fifth writing. The first writing is configured to write a symbol included in one code word among the eight code words to the first page in a first word line among the plurality of word lines. The control unit is configured to perform the second writing after the first writing. The second writing is configured to write a symbol included in a code word identical to the code word used for the first writing to the first page in a word line adjacent to the first word line. The symbol is a symbol different from the symbol in the first writing. The control unit is configured to perform the fifth writing after the second writing. The fifth writing is configured to repeatedly perform the third writing and the fourth writing in sequence. The third writing is configured to write a symbol included in a code word different from a code word used for a writing performed immediately before among the first or the fourth writing to the second page in a word line on which writing to the first page has been executed oldest among word lines to which the second page has not been written. The fourth writing is configured to write a symbol included in a code word identical to the code word used for the third writing to the first page in a word line adjacent to the word line adjacent to the word line in the third writing. The symbol is a symbol different from the symbol for the third writing. The word line is a word line to which data has not been written.

Exemplary embodiments of the memory system and a memory control method will be explained below in detail with reference to the accompanying drawings. The present invention is not limited to the following embodiments.

First Embodiment

Figure 1:
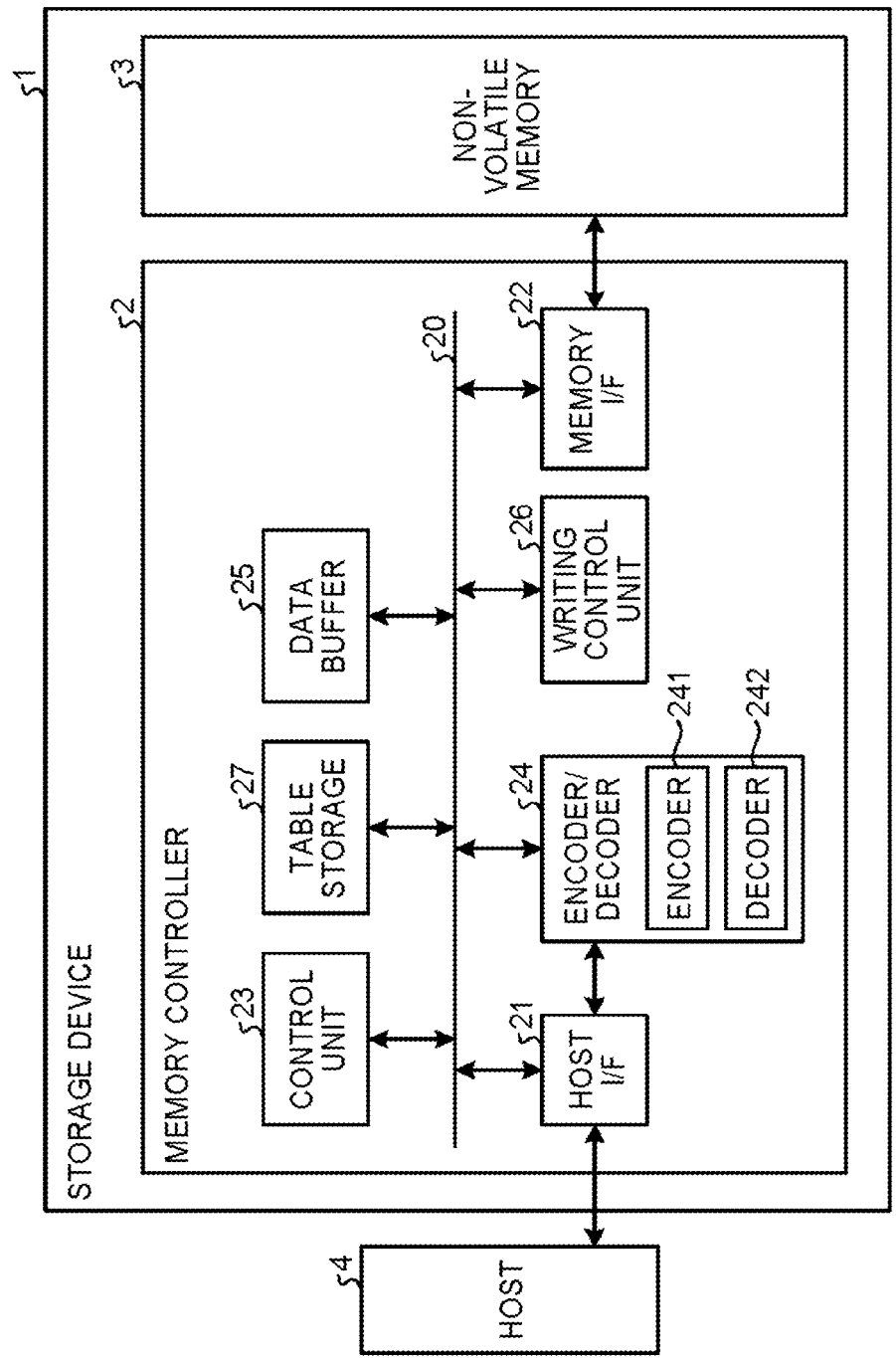
FIG. 1 is block drawing illustrating an exemplary configuration of a storage device according to an embodiment.

FIG. 1 is a block diagram illustrating an exemplary configuration of a storage device (memory system) according to an embodiment. A storage device 1 of this embodiment includes a memory controller 2 and a non-volatile memory 3. The storage device 1 is coupled to a host 4 with communication line and functions as an external storage device of the host 4. The host 4 is, for example, an electronic device, a personal computer, a mobile terminal, and the like. The host 4 may also be an imaging device, a still camera, a video camera, and the like. The host 4 may be a tablet, a smart phone, a game console, a car navigation system, a printer device, a scanner device, a server system, and the like.

The non-volatile memory is a non-volatile memory that stores data in a non-volatile manner, for example, a NAND memory. While an example using the NAND memory as the non-volatile memory will be described here, as the non-volatile memory, a storage unit other than the NAND memory, a three-dimensional structure flash memory, a resistance random access memory (ReRAM), a ferroelectric random access memory (FeRAM), and the like may be used. Here, the description uses an example of using a semiconductor memory as the storage unit. However, an error correction process of this embodiment may be applied to a storage device, using a storage unit other than the semiconductor memory.

In accordance with a write co and (request) from the host 4, the memory controller 2 controls writing to the non-volatile memory. In accordance with a read command from the host 4, the memory controller 2 controls ding from the non-volatile memory. The memory controller 2 includes a Host interface (Host I/F) 21, a memory interface (memory I/F) 22, a control unit 23, an Encoder/Decoder 24, a data buffer 25, a writing control unit 26, and a table storage 27. The Host I/F 21, the memory I/F 22, the control unit 23, the Encoder/Decoder 24, the data buffer 25, the writing control unit 26, and the table storage 27 are coupled with an internal bus 20.

The Host I/F 21 performs a process in accordance with an interface standard with the host 4. The Host I/F 21 outputs an instruction, user data, and the like received from the host 4 to the internal bus 20. The Host I/F 21 transmits the user data read from the non-volatile memory, a response from the control unit 23, and the like to the host 4. This embodiment calls data written to the non-volatile memory 3 upon a write request from the host 4 as the user data.

The memory I/F 22 performs a process to rite writing data to the non-volatile memory based on a co and from the control unit 23. Based on the command from the control unit 23, the memory I/F 22 performs a read process from the non-volatile memory 3.

The control unit 23 is a control unit that integrally controls respective configuration members of the storage device 1. The control unit 23 is configured of, for example, a central processing unit (CPU) and a micro controller unit (MPU). When the control unit 23 receives an instruction from the host 4 via the Host I/F 21, the control unit 23 performs a control in accordance with the instruction. For example, in accordance with the instruction from the host 4, the control unit 23 instructs the memory I/F 22 to write the user data and a parity to the non-volatile memory 3. In accordance with the instruction from the host 4, the control unit 23 instructs the memory I/F 22 to read the user data and the parity from the non-volatile memory 3. The non-volatile memory 3 may store data other than the user data, namely, data used for a control inside the semiconductor storage device 1 (hereinafter referred to as control data). In this case, the control unit 23 also instructs the memory I/F 22 to write and read these control data.

The control unit 23 determines a storage area (memory area) on the non-volatile memory 3 for the user data accumulated in the data buffer 25. The data buffer 25 stores the user data via the internal bus 20. The control unit 23 determines the memory area for each data in units of pages (page data), which is a unit written to the non-volatile memory 3. This description defines the memory cells coupled in common to one word line as a memory cell group. In the case where the memory cells are multi-level cells, the memory cell group handles a plurality of pages. This embodiment uses the multi-level cells (2 bits/cell) that can store two bits, a first bit and a second bit, in one memory cell as the memory cells of the non-volatile memory 3. The first bit of the memory cell in the memory cell group configures a Lower page (hereinafter referred to as an L page), which is the first page. The second bit of the memory cell in the memory cell group configures an Upper page (hereinafter referred to as a U page), which is the second page. Deletion is performed on the non-volatile memory in units of components referred to as a block. One block includes a plurality of memory cell groups, namely, a plurality of word lines.

The control unit 23 determines the memory area in the non-volatile memory 3, which is the write destination of the user data. In this embodiment, the memory controller 2 distributes code words generated by coding the user data to the plurality of pages in the non-volatile memory 3 as described later. In this embodiment, the memory controller 2 performs the writing to the plurality of pages in the non-volatile memory 3 in units of the plurality of code words in accordance with a preliminarily determined rule. The writing control unit 26 controls the writing in the plurality of code words. Accordingly, the control unit 23 determines the memory area in the non-volatile memory of the write destination in units of the plurality of code words. To store the control data as well, which is data other than the user data, in the non-volatile memory 3, the control unit 23 similarly determines the storage area (memory area) on the non-volatile memory 3 for the control data as well. Eased on the memory area determined in units of the plurality of code words and the above-described rule, the control unit 23 determines the memory area in the write destination of the data for each page. A physical address is assigned for the memory area in the non-volatile memory. The control unit 23 manages the memory area in the write destination using the physical address. The control unit 23 specifies the memory area (physical address) determined in units of the plurality of code words and instructs the writing control unit 26 to write the user data to the non-volatile memory. The table storage 27 stores a correspondence between a logical address of the user data received from the host 4 and the physical address indicative of the storage area on the non-volatile memory 3 where this user data has been stored as an address conversion table. The logical address is the address of the user data managed by the host 4. That is, the logical address is information to identify the user data managed by the host 4. The address conversion table may directly indicate the correspondence between the logical address and the physical address, or may be a table configured by multiple levels. The multiple-level table means a plurality of tables used for once converting the logical address into an intermediate address and then converting the intermediate address into the physical address.

When control unit 23 receives the read request from the host 4, the control unit 23 converts the logical address specified by the read request into the physical address using the above-described address conversion table and instructs the memory I/F 22 to read the data from this physical address.

The data buffer 25 temporarily stores the user data that the memory controller 2 has received from the host 4 until storage to the non-volatile memory 3. The data buffer 25 temporarily stores the user data read from the non-volatile memory 3 until transmission to the host 4. Furthermore, the data buffer 25 is also used to temporarily store the code word generated by a coding process, which will be described later. The data buffer 25 is also used to temporarily store data target for decoding during decoding the data read from the non-volatile memory 3. The data buffer 25 is constituted of, for example, a general-purpose memory, a static random access memory (SRAM), a dynamic random access memory (DRAM), and the like.

The user data transmitted from the host 4 is forwarded to the internal bus 20 and then is stored in the data buffer 25. The Encoder/Decoder 24 includes an ENCODER 241 and a DECODER 242. The ENCODER 241 codes the data (user data and control data) stored in the non-volatile memory 3 to generate the code words and stores the code words in the data buffer 25. As described later, one code word is stored across the plurality of pages. A method for coding the user data and a method for coding the control data may differ or may be identical. Any method may be used as the method for coding. Here, an example of using a reed solomon (RS) coding will be described. However, this should not be limited. Insofar as the error correction can be line-coded in units of symbols, the operation of coding of this embodiment is applicable. The DECODER 242 performs a decoding process on data read from the non-volatile memory, that is, received terms corresponding to the written code words. The details of the coding and decoding of this embodiment will be described later.

When the control unit 23 specifies the physical address in units of the plurality of code words and instructs the writing control unit 26 of this embodiment to write the user data to the non-volatile memory 3, in accordance with a writing order, which will be described later, the writing control unit 26 instructs the memory I/F 22 to write the data to each page in the non-volatile memory 3. The writing control unit 26 manages the storage location of the data included in the code words on the non-volatile memory 3 per code word. To read the received term, which is the data corresponding to the code word from the non-volatile memory 3, based on the managed storage location, the writing control unit 26 instructs the memory I/F 22 to sequentially read the data corresponding to the read received term. The control unit 23 may perform the above-described operations by the writing control unit 26.

Figure 2:
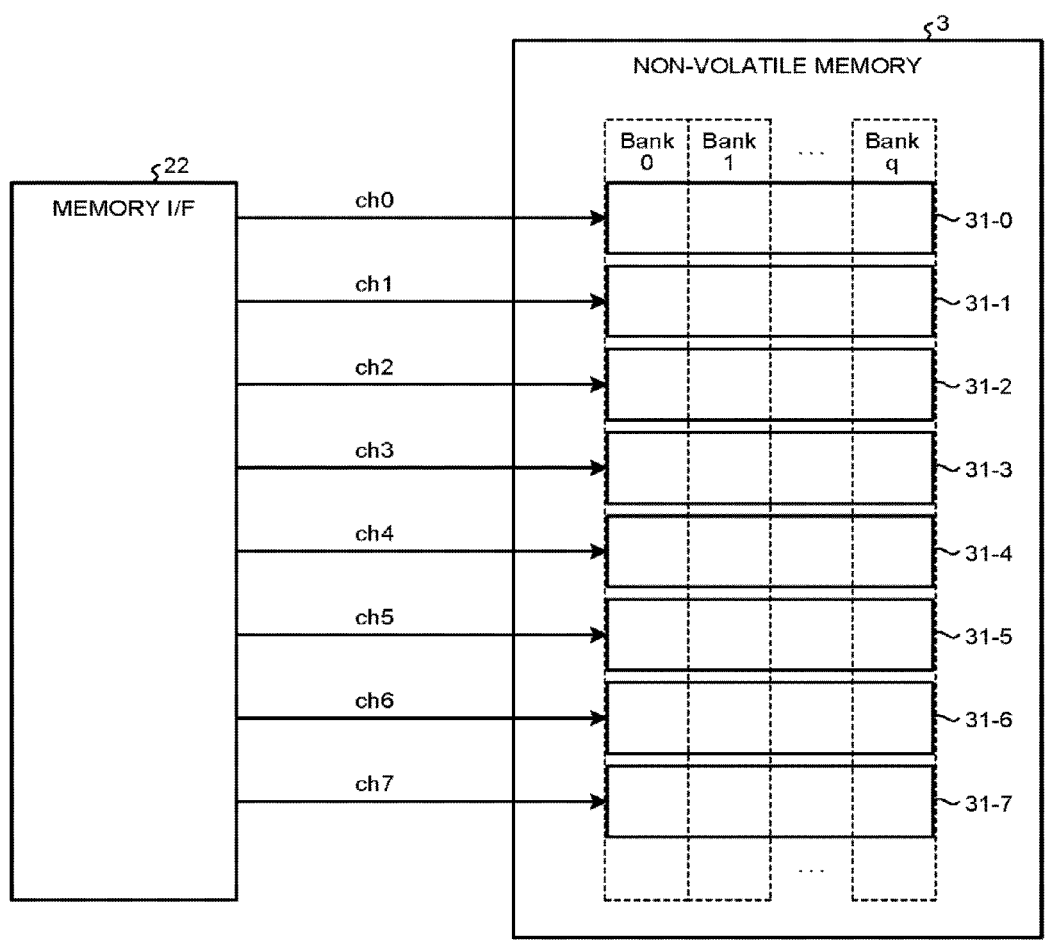
FIG. 2 is a drawing illustrating an exemplary configuration of Bank.

As described above, this embodiment describes an example where the non-volatile memory 3 is the NAND memory. The following describes the non-volatile memory 3. FIG. 2 is a drawing illustrating an exemplary configuration of the non-volatile memory 3 of this embodiment. The non-volatile memory 3 of this embodiment can operate eight channel elements 31-0 to 31-7 corresponding to eight channels of ch0 to ch7 of the memory I/F 22 in parallel.

Banks are constituted across the channel elements 31-0 to 31-7. The block for each channel element corresponding to one Bank is referred to as a bank element. That is, one Bank is constituted of the eight bank elements for eight channels. In the example of FIG. 2, the non-volatile memory 3 includes (q−1) Banks from Bank0 to Bankq. Each Bank can independently perform the writing/reading/deletion operations.

Figure 3:
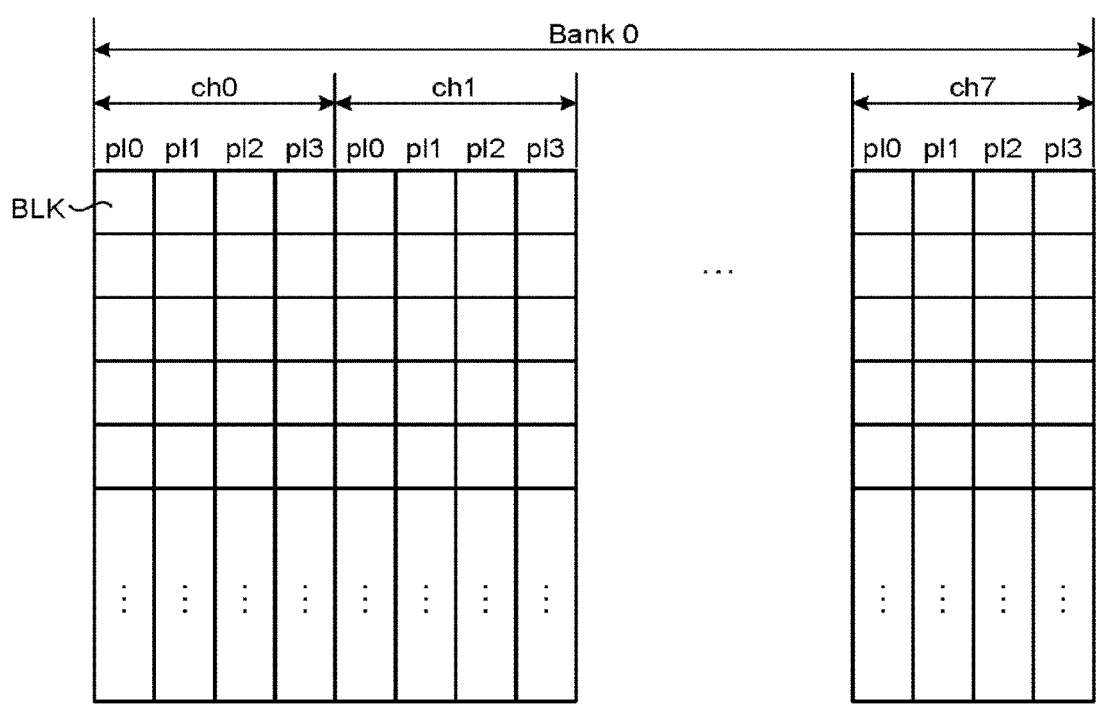
FIG. 3 is a drawing illustrating an exemplary configuration of a block of memory cell arrays in a two-dimensional structure.

The channel elements 31-0 to 31-7 each have four planes p10 to p13. FIG. 3 is a drawing illustrating an exemplary configuration of Bank0. Hereinafter, the channel elements 31-0 to 31-7 corresponding to ch0 to ch7 are abbreviated as ch0 to ch7, respectively. As illustrated in FIG. 3, ch0 to ch7 each have the four planes p10 to p13. Similar to Bank0, ch0 to ch7 of Bank1 to Bankq each also have the four planes p10 to p13. Similarly, p10 to p13 can perform deletion/writing/reading at the same time. The planes are each constituted of a plurality of blocks (BLKs).

Figure 4:
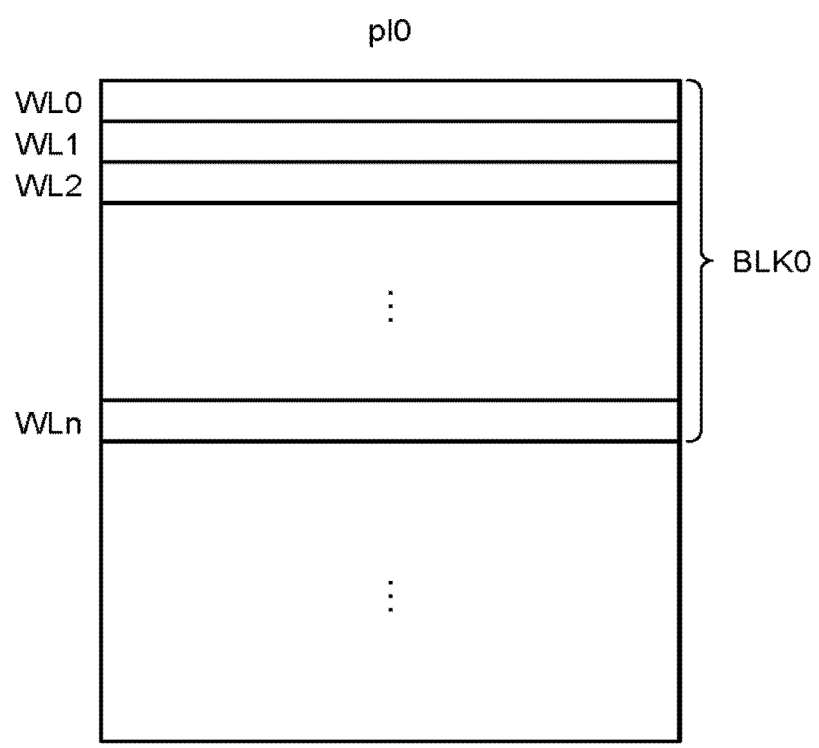
FIG. 4 is a drawing illustrating an exemplary configuration of a plane.

FIG. 4 is a drawing illustrating an exemplary configuration of the plane. As illustrated in FIG. 4, p10 is constituted of the plurality of blocks. BLK0, which is one block among the plurality of blocks, includes (n+1) word lines WL0 to WLn. Similarly, other blocks also have the (n+1) word lines WL0 to WLn. FIG. 4 illustrates the example of configuration of p10. Similarly, p11 to p13 are also constituted of the plurality of blocks.

FIG. 5 is a drawing illustrating an exemplary configuration of the block in the non-volatile memory 3. FIG. 5 illustrates one block among the plurality of blocks constituting the non-volatile memory 3. Other blocks in the non-volatile memory 3 also have the similar configuration to the configuration of FIG. 5. As illustrated in FIG. 5, a block BLK in the non-volatile memory 3 includes (m+1) (m indicates an integer of 0 or more) NAND strings NS. The respective NAND strings NS share a diffused area (a source region or a drain region) between adjacent memory cell transistors MT. The NAND string NS includes memory cell transistors MT0 to MTn and selection transistors ST1 and ST2. The (n+1) (n indicates an integer of 0 or more) memory cell transistors MT0 to MTn are coupled in series. The selection transistors ST1 and ST2 are arranged at both ends of these (n+1) memory cell transistors MT0 to MTn rows.

To each control gate electrode of the memory cell transistors MT0 to MTn, which constitute the NAND string NS, the word lines WL0 to WLn are coupled. Between the memory cell transistors MTz (z=0 to n) in the respective NAND strings NS are coupled in common by the identical word line WLz (z=0 to n). That is, in the block BLK, the control gate electrodes of the memory cell transistors MTz on the identical line are coupled to the identical word line WLz.

The memory cell transistors MT0 to MTn are each constituted of a field-effect type transistor having a stacked layer gate structure formed on a semiconductor substrate. Here, the stacked layer gate structure includes an electric charge accumulating layer (floating gate electrode) and the control gate electrode. The electric charge accumulating layer is formed by interposing a gate insulating film on the semiconductor substrate. The control gate electrode is formed by interposing a gate-to-gate insulating film on this electric charge accumulating layer. The memory cell transistors MT0 to MTn change a threshold voltage according to a count of electrons accumulated in the floating gate electrode. According to the difference of this threshold voltage, data can be stored.

Bit lines BL0 to BLm are coupled to each drain of the (m+1) selection transistors ST1 in the one block ELK. A selection gate line SGD is coupled in common to the gates. The source of the selection transistor ST1 is coupled to the drain of the memory cell transistor MT0. Similarly, a source line SL is coupled in common to sources of (m+1) selection transistors ST2 in the one block BLK. A selection gate line SGS is coupled in common to the gates. The drain of the selection transistor ST2 is coupled to the source of the memory cell transistor MTn.

The memory cells are each coupled to the bit lines as well as being coupled to the word lines. Each memory cell can be identified with an address for identifying the word line and an address for identifying the bit line. As described above, the data in the memory cell (the memory cell transistor MT) in the identical block BLK are batch-deleted. Meanwhile, data is read and written in units of the plurality of memory cells coupled in common to any of the word lines WL, that is, a memory group MS.

The following describes a write process and a read process of this embodiment. As described above, the storage device 1 of this embodiment writes the code words generated by coding the user data (or the user data and the control data) to the non-volatile memory 3 dispersedly to the plurality of pages. This allows handling an erasure of data in units of pages.

For example, assume that the memory controller generates the code word formed of 128 symbols in total; a count of information symbols of 126 and a count of redundant symbols of 2. The use of this code word can correct the erasure up to two symbols. Then, when the memory controller 2 stores these 128 symbols to the respective different pages in the non-volatile memory 3, even if the data lost in units of pages occurs by two pages, the data can be restored.

On the other hand, in the case where the data lost by the respective two adjacent word lines in the four planes in one channel are lost at the same time, 4×2=8 WL is lost at the same time. As described above, in this embodiment, since the memory cell in the non-volatile memory 3 can store two bits, data in 16 pages in total are lost at the same time. If the data stored in these pages is the data included in one code word, the data cannot be restored. To ensure restoration of data even if data across the two adjacent word lines in the four planes in one channel occurs, a countermeasure of increasing the count of redundant symbols is possible. However, this countermeasure increases a ratio of the redundant data to the user data (or the user data and the control data) stored in the non-volatile memory 3. This reduces an amount of the user data storable to the non-volatile memory 3. In view of this, the memory controller 2 of this embodiment writes the code word as described later while not changing the ratio of the redundant data to the user data (or the user data and the control data) stored in the non-volatile memory 3 to ensure restoring the data even if the data across the adjacent two word lines in the four planes in one channel are lost at the same time.

Here, this embodiment represents by abbreviating a symbol written to the memory cells coupled to the identical word line, that is, the memory cells belonging to the identical memory cell group as a symbol written to the identical word line. If the above-described data across the adjacent two word lines in the four planes are lost at the same time, to ensure the restoration of the data with the code word that can correct two symbols, it is only necessary that among 16 symbols corresponding to the adjacent two word lines in the four planes, the symbols belonging to the identical code word are up to two symbols, and the symbols written to the identical word line, that is, symbols of the U page and the L page written to the identical word line belong to different code words. That is, it is only necessary that 16 symbols corresponding to the adjacent two word lines in the four planes are constituted of each of two symbols for eight code words, and the symbols written to the identical word line belong to different code words. Hereinafter, this embodiment calls a method for determining the page in the write destination for such eight code words as a method for arranging the code words that handles the data erasure of the adjacent word lines in four planes. However, if the writing is simply performed under such condition, a control of writing to the non-volatile memory 3 is possibly complicated. In view of this, the memory controller 2 of this embodiment uses the writing order to the respective pages in the non-volatile memory 3 to perform efficient writing.

FIG. 6 is a drawing illustrating an exemplary order of writing to each page in the non-volatile memory 3. The NAND memory stores information by an electric charge amount accumulated in the floating gate of the memory cell. Generally, the writing is consecutively performed across the plurality of word lines. However, in this case, the writing to a certain word line possibly varies the electric charge amount of the memory cell in the adjacent word line, that is, causes an interference between the adjacent cells. Especially, to avoid the interference between the adjacent cells generated in a state where in the writing to the L page in a certain word line, the word line adjacent to this word line terminates the writing to the L page but does not terminate the writing to the U page, the NAND memory performs writing of the L page after the adjacent word line completes a program of a U page stage. The storage device 1 of this embodiment also performs writing to the non-volatile memory 3 in the order illustrated in FIG. 6 to avoid the interference between the adjacent cells.

FIG. 6 indicates the U page and the L page corresponding to the respective word lines as U and L. The writing order to the respective pages is indicated by values. As illustrated in FIG. 6, first, namely, in the 0th writing, writing to the L page of WL0 is performed, and then, in the first writing, the writing to the L page of WL1 is performed. Next, in the second writing, writing to the U page of WL0 is performed, and then in the third writing, the writing to the L page of WL2 is performed. Next, in the fourth writing, the writing to U page of WL1 is performed, and then in fifth writing, the writing to the L page of WL3 is performed. Hereinafter, thus, writing to the L page of ith (i indicates an integer of 2 or more) word line WLi, and then the writing to the U page of (i−2)th word line WL(i−1) are repeated. Finally, after the writing to the U page of WL(n−1), the writing to the U page of WLn is performed. Thus, the writing of one block is terminated.

A page 100, which is the U page of WL0, and a page 101, which is the L page of WL2, illustrated in FIG. 6 are pages to be consecutively written. However, the word lines corresponding to these pages are not adjacent. In view of this, even if the symbols included in the identical code word are written to the page 100 and the page 101, a failure mode where the above-described data across the adjacent two word lines in the four planes are lost at the same time does not gives an influence. In view of this, regardless of the arrangement of the code words performed as the countermeasure against the failure mode where the above-described data across the adjacent two word lines in the four planes are lost at the same time, the data included in the identical code word can be consecutively written to the page 100 and the page 101. In general, writing the data included in the identical code word by repeated writing to the L page of the ith word line WLi and the U page of (i−2)th word line WL(i−1) allows efficient writing avoiding a complicated write procedure while taking the countermeasure against the failure mode where the data across the adjacent two word lines in the four planes are lost at the same time.

Figure 7:
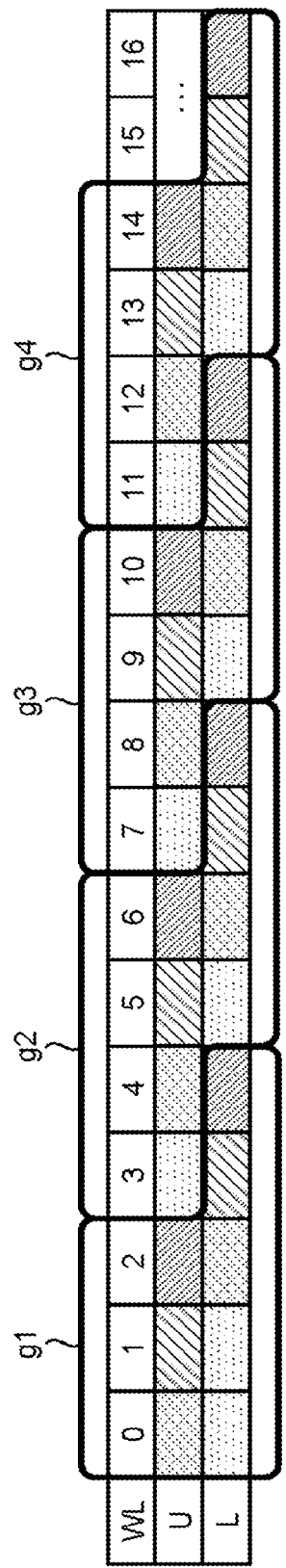
FIG. 7 is a drawing illustrating an exemplary method for arranging code words using the writing order illustrated in FIG. 6.

FIG. 7 is a drawing illustrating an exemplary method for arranging the code words using the writing order illustrated in FIG. 6. Here, an example where data by one page is one symbol is described. An example where the data by one page is consisted of the plurality of symbols is described later. FIG. 7 illustrates an exemplary method for arranging the code words in one plane. As illustrated in FIG. 7, the memory controller 2 of this embodiment repeats the writing of the symbols of the identical code word consecutively to the two pages and the writing of the symbols of different code words consecutively to the two pages in one plane based on the writing order illustrated in FIG. 6. Thus, the writing to eight pages in total is performed. Then, as illustrated in a group g1 in FIG. 7, the four kinds of code words are written in units of two symbols. Afterwards, similar to the group g1, the writing of the four kinds of code words in units of two symbols is repeated, and the writing to eight pages in total is performed. Thus, the writing to a group g2 is completed. The symbols in units of eight pages thus written are each referred to as the groups g1, g2, g3, and g4. In FIG. 7, the parts with identically hatched in the identical group indicate symbols included in the identical code word. As described later, the parts in different groups with the identical hatching are not always the identical code word. When performing the writing as illustrated in FIG. 7, excluding WL0 and WL1 and WL(n−1) and WLn, the symbols included in the identical code word are not written to the word line adjacent in the plane.

FIG. 8 is a drawing illustrating an exemplary method for arranging the code words in the four planes. A, B, C, D, E, F, G, and H in FIG. 8 indicate symbols included in the code words A, B, C, D, E, F, G, and H, respectively. FIG. 8 illustrates the arrangement of the code words for one channel. However, the arrangement of the code words is identical among the all channels. The values in the parentheses indicate the writing order of the respective pages illustrated in FIG. 6, namely, the respective symbols. For example, in p10, the 0th writing writes the first symbol of a code word A to the L page of WL0, the first writing writes the second symbol of the code word A to the L page of WL1, the second writing writes the first symbol of a code word B to the U page of WL0, and the third writing writes the second symbol of the code word B to the L page of WL2. Hereinafter, similarly, when the two symbols of a code word C and the two symbols of a code word D are written, the writing of the parts corresponding to the group g1 in FIG. 7 is terminated. Afterwards, as the writing of the group g2, the two symbols of the code word A are written, the two symbols of the code word B are written, the two symbols of the code word C are written, and the two symbols of the code word D are written again.

FIG. 8 illustrates an exemplary method for arranging the code words in the one channel, namely, four planes in the case where a count of Banks is one or in the case where even if the Banks are plural, one code word is not dispersedly arranged to the plurality of Banks. In this case, the count of symbols v the one code word per channel is the value found by dividing 128 into 8, which is the count of channels, namely, 16. When distributing and arranging the 16 symbols to the four planes in one channel, the count of symbols per plane is four. In view of this, the four symbols included in the code word A are stored to the respective four pages in one plane.

As described above, to handle the data erasure in the adjacent word lines in the four planes, it is only necessary that the symbols included in one code word may be two or less in 16 pages in total corresponding to the two adjacent word lines in the four planes. In the example of FIG. 8, it is presumed that as illustrated in FIG. 7, when the symbols of the identical code word are written to two pages consecutively in the one plane, symbols of other code words are written to two pages consecutively, thus repeating the writing. In the one plane, in the four pages in the adjacent two word lines, the count of symbols included in the identical code word is one. Accordingly, even if the writing is performed on the two planes by the identical method for arranging the code words, the count of symbols included in the identical code word in the adjacent two word lines in the four planes is two. Accordingly, even if the data is lost in the adjacent two word lines in the four planes, the data can be restored.

In view of this, to avoid complicated write process and reduce the count of code words held in the data buffer 25 at once, this embodiment uses the method for arranging the identical code word in the two planes. FIG. 8 illustrates the example of using the method for arranging the identical code word between p10 and p11 and using the method for arranging the identical code word between p12 and p13. However, this should not be limited. The method for arranging the identical code word may be used between p10 and p12, and the method for arranging the identical code word may be used between p11 and p13. The method for arranging the identical code word may be used between p10 and p13, and the method for arranging the identical code word may be used between p12 and p13.

Considering the above-described conditions, the following method is possible. Among the four planes, the writing is performed on the two planes by the method for arranging the identical code word using the four code words and the other two planes among the four planes, using the four code words different from the above-described four code words, the writing is performed by the method for arranging the identical code word. FIG. 8 illustrates the method for arranging the code words written by this method. In the example of FIG. 8, p10 and p11 repeat writing the code words A, B, C, and D in units of two symbols twice. Meanwhile, p12 and p113 repeat writing the code words E, F, G, and H in units of two symbols twice. That is, viewing one plane, the group g1 and the group g2 in FIG. 7 use the identical four code words. As described above, in the case where the code words are formed of 128 symbols and are dispersedly arranged to eight channels, the writing of code word groups including the eight code words as one set is terminated in the group g1 and group g2. Furthermore, subsequently, writing of other eight code words, that is, the code word group including eight code words different from A, B, C, D, E, F, G, and H as one set (corresponds to the group g2 and the group g3 in FIG. 7) is performed. Hereinafter, the writing configuring the eight code words as one set is repeated.

In FIG. 8, the symbols denoted as A are symbols included in the code word A. However, since the symbols included in the code word A are dispersedly arranged by one for each page, the symbols denoted as A are not the identical symbols. As described above, the 0th symbol of the code word A is written to the L page of WL0 of p10, and the first symbol of the code word A is written to the L page of WL1. To perform such writing by eight channels, for example, each code word on the data buffer 25 is divided in units of four symbols corresponding to each plane in each channel, that is, each code word is divided into 32. Then, the positions of the divided four symbols are each made correspond to the planes in each channel. Among the four symbols corresponding to each plane in each channel, the 0th and first symbols are consecutively written and the second and third symbols are consecutively written.

When writing the code words illustrated in FIG. 8, a symbol group 200 corresponding to the data in the adjacent two word lines in the four planes are formed of two symbols of the code words A, B, C, D, E, F, G, and H for each. Accordingly, it can be seen that even if the data in the adjacent two word lines in the four planes is lost at once, the data is restorable. However, as described above, regarding the word lines of WL0 and WL1; and WL(n−1) and WLn, the symbols of the identical code word are written consecutively to the adjacent word lines. Accordingly, if these data in the adjacent word lines in the four planes are lost at the same time, these data is not restorable. However, the unrestorable data is few among the whole data. Although FIG. 8 illustrates one channel, the code words are also similarly written to the other seven channels.

FIG. 8 illustrate the example of writing the code words A, B, C, and D to p10 and p11 and writing the code words E, F, G, and H to p12 and p113. However, the code words A, B, C, D, E, F, G, and H can be dispersedly written to p10 to p13. FIG. 9 is a drawing illustrating an exemplary code word arrangement different from FIG. 8, in the case where a count of Banks is one or in the case where even if the Banks are plural, one code word is not dispersedly arranged to the plurality of Banks similar to FIG. 8. In the example of FIG. 9, in p10 and p11, the code words A, B, C, and D are written to the group g1 in FIG. 7 and then the code words E, F, G, and H are written to the group g2. Further, in p12 and p13, the code words E, F, G, and H are written to the group g1 in FIG. 7 and then the code words A, B, C, and D are written to the group g2. Thus, four code words can be replaced in units of groups.

Figure 10:
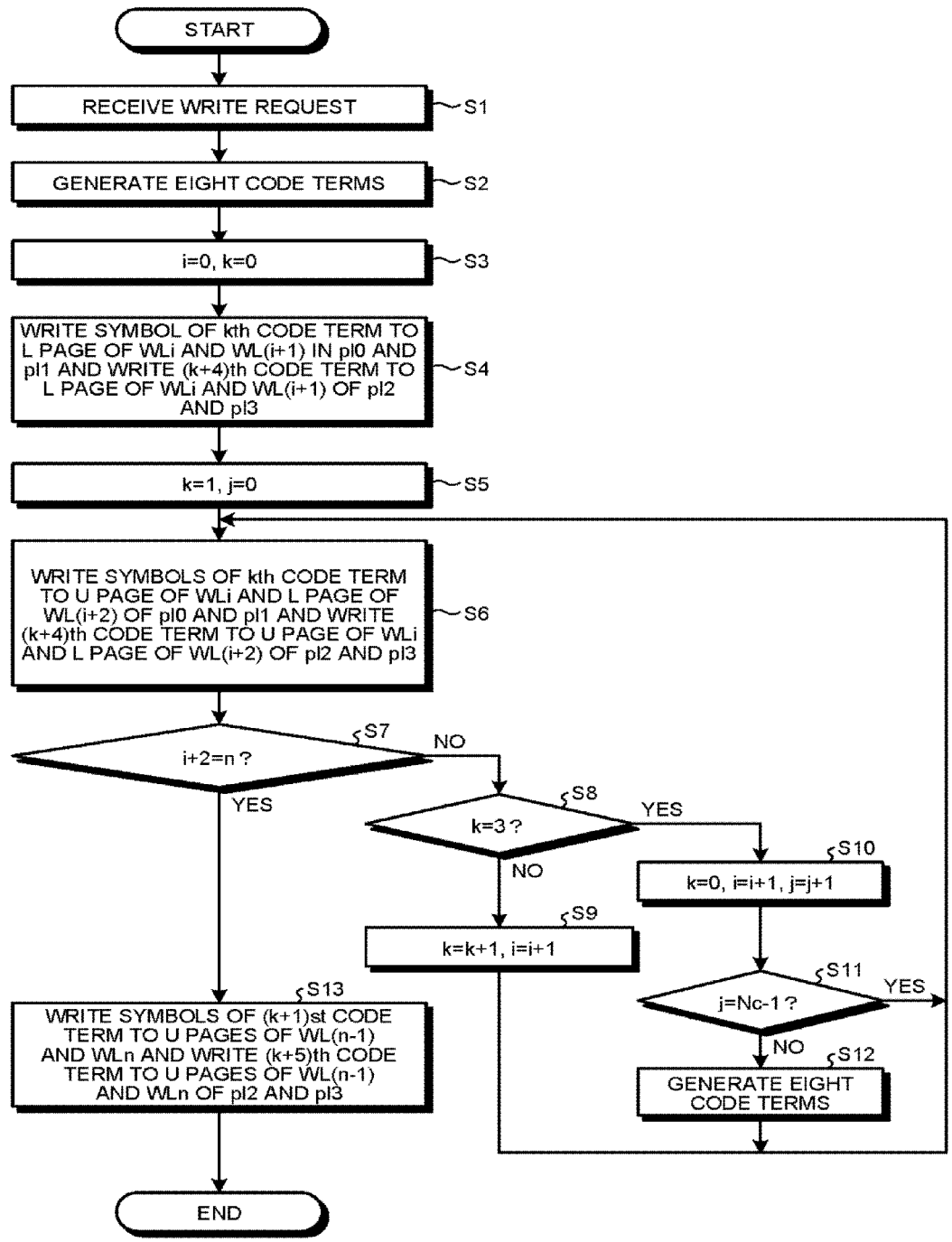
FIG. 10 is a drawing illustrating an exemplary procedure for a writing process of an embodiment.

FIG. 10 is a drawing illustrating an exemplary procedure for a writing process of the embodiment. FIG. 10 illustrates the procedure to perform writing on one block in all channels presuming the writing of the code words as illustrated in FIG. 8. First, when receiving the write request from the host 4 (Step S1), the memory controller 2 generates the eight code words (Step S2). Specifically, when receiving the write request from the host 4, the control unit 23 instructs the ENCODER 241 to perform coding. The ENCODER 241 codes the user data stored in the data buffer 25 to generate the eight code words, and the eight code words are stored in the data buffer 25.

Next, the writing control unit 26 of the memory controller 2 initializes a variable i indicative of the word line and a variable k indicative of a number of the code word to 0 (Step S3). Next, the memory controller 2 writes the symbol of the kth code word to the L page of WLi and WL(i+1) in p10 and p11 in the all channels and writes the symbol of the (k+4)th code word to the L page of WLi and WL(i+1) of p12 and p13 in the all channels (Step S4). Specifically, the control unit 23 determines the write destination of the eight code words in units of eight code words on the non-volatile memory 3. The control unit 22 instructs the physical address indicative of the write destination (for example, the physical address at the head of the memory area where the eight code words are to be written) and information for identifying the code words to be written (for example, the storage location of the code words stored in the data buffer 25 on the data buffer 25) to the writing control unit 26. The writing control unit 26 divides the respective code words in units of four symbols. The writing control unit 26 causes the divided four symbols to be corresponded to the each plane in each channel. Then, the writing control unit 26 writes the 0th symbol among the four symbols corresponding to these channel and plane among the symbols of the kth code word to the L page of WLi in units of the channels and planes. Next, the writing control unit 26 instructs the memory I/F 22 to write the first symbol among the four symbols corresponding to these channel and plane to the L page of WL(i+1). In accordance with the command, the memory I/F 22 performs the writing.

Figure 11:
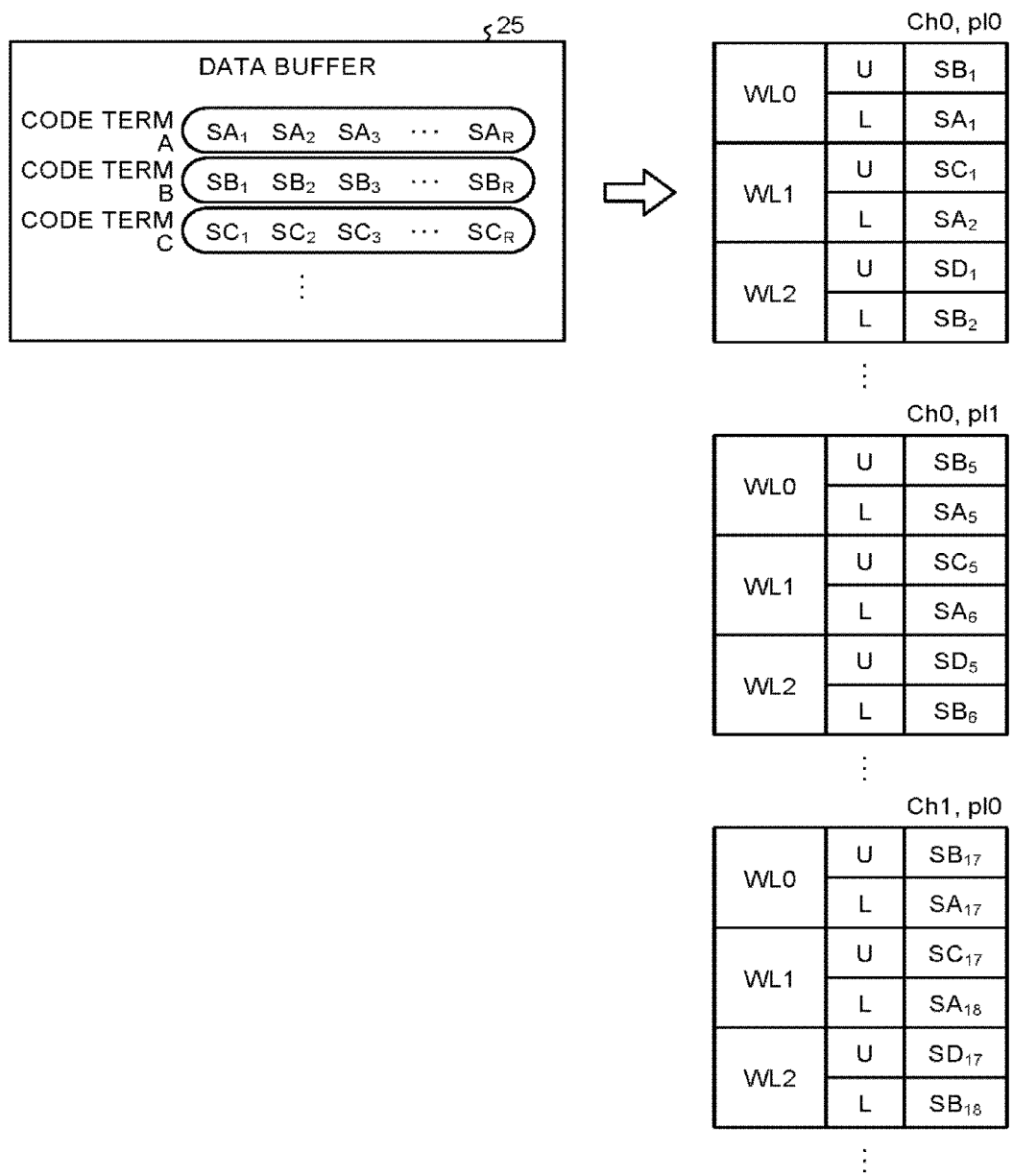
FIG. 11 is a drawing illustrating correspondences between symbols included in the code word on a data buffer 25 and storage locations of these symbols on a non-volatile memory 3.

FIG. 11 is a drawing illustrating correspondences between symbols included in the code word on the data buffer 25 and storage locations of these symbols on the non-volatile memory 3. $SA_1$, $SA_2$, $SA_3$, . . . , $SA_R$ represent the first, second, third, . . . , Rth symbols included in the code word A, respectively. Similarly, $SB_1$, $SB_2$, $SB_3$, . . . , $SB_R$ represent the first, second, third, . . . , Rth symbols included in the code word B, respectively. $SC_1$, $SC_2$, $SC_3$, . . . , $SC_R$ represent the first, second, third, . . . , Rth symbols included in the code word C, respectively. In this embodiment, R=128. Among the 128 symbols included in the code word on the data buffer 25, the four symbols correspond to one plane in one channel. The writing control unit 26, for example, makes the four symbols $SA_1$ to $SA_4$ correspond to p10 in ch0, makes the four symbols $SA_5$ to $SA_8$ correspond to p11 in ch0, makes the four symbols $SA_9$ to $SA_{12}$ correspond to p12 in ch0, and makes the four symbols $SA_{13}$ to $SA_{16}$ correspond to p13 in ch0. Then, the writing control unit 26 makes the four symbols $SA_{17}$ to $SA_{20}$ correspond to p10 in ch1. Hereinafter, the writing control unit 26 similarly makes four symbols correspond to each channel and plane. In this case, the symbols stored in the non-volatile memory 3 are arranged as illustrated on the right side in FIG. 11.

Now returning to the description in FIG. 10, next, the writing control unit 26 of the memory controller 2 sets k=1 and j, which is a variable indicative of a repeat count in units of groups, to 0 (Step S5). The writing control unit 26 writes the symbols of the kth code word to the U page of WLi and the L page of WL(i+2) of p10 and p11 in the all channels and writes the symbol of the (k+4)th code word to the U page of WLi and the L page of WL(i+2) of p12 and p13 in the all channels (Step S6). Specifically, the writing control unit 26 writes the 0th symbol among the four symbols corresponding to these channel and plane among the symbols of the kth code word to the U page of WLi in units of the channels and planes. Next, the writing control unit 26 instructs the memory I/F 22 to write the first symbol among the four symbols corresponding to these channel and plane to the L page of WL(i+2). In accordance with the command, the memory I/F 22 performs the writing.

Next, the writing control unit 26 of the memory controller 2 determines whether i+2 is n or not (Step S7). N is a number indicative of the last word line in the block. If i+2 is not n (No at Step S7), the writing control unit 26 determines whether k is 3 or not (Step S8). If k is not 3 (No at Step S8), the writing control unit 26 determines that k=k+1 and i=i+1 (Step S9) and returns to Step S6.

In the case where k is 3 (Yes at Step S8), the writing control unit 26 determines that k=0, i=i+1, and j=j+1 (Step S10) and determines whether j is $N_c$−1 or not (Step S11). $N_c$ indicates the repeat count in units of the groups (groups corresponding to the four code words illustrated in FIG. 7). In the example of FIG. 8, $N_c$=2. In the case of j is $N_c$−1 (Yes at Step S11), the memory controller 2 generates the subsequent eight code words (Step S12) and returns to Step S6.

If j is not $N_c$−1 (No at Step S11), the process returns to Step S6. When i+2 is n (Yes at Step S7), the symbols of the (k+1)st code word are written to the U pages of WL(n−1) and WLn of p10 and p11 in all the channels. The symbols of the (k+5)th code word are written to the U pages of WL(n−1) and WLn of p12 and p13 in all the channels (Step S13), and the process is terminated. Specifically, the writing control unit 26 writes the second symbol among the four symbols corresponding to these channel and plane among the symbols of the (k+1)th code word to the U page of WL(n−1) in units of the channels and planes. Next, the writing control unit 26 instructs the memory I/F 22 to write the third symbol among the four symbols corresponding to these channel and plane to the U page of WLn. In accordance with the command, the memory I/F 22 performs the writing. Here, it is premised that the word lines, which constitutes one block, are multiples of eight; therefore, when i+1 is n, k is 2. Step S13 writes the symbols of the third code word to the U pages of WL(n−1) and WLn of p10 and p11 in all the channels and writes the symbols of the 7th code word to the U pages of WL(n−1) and WLn of p12 and p13 in all the channels.

The above description describes that the one-page data is one symbol. However, in the case where one page is constituted by the plurality of symbols, the method for arranging the code words in this embodiment is also applicable. For example, in the case where the symbols included in one page is two, a symbol 0 and a symbol 1, it is only necessary that the above-described method for arranging the code words is used for the symbol 0, the code word different from the symbol 0 is generated for the symbol 1, and the code words are arranged using the above-described method for arranging the code words.

FIG. 10 describes the example of the user data. However, to code the control data and store the control data to the non-volatile memory 3, not the write request from the host 4 but the necessity of writing in the memory controller 2 triggers the writing start. Except for this, the procedure is similar to the procedure described in FIG. 10.

To read data from the non-volatile memory 3, the writing control unit 26 instructs the memory I/F 22 to read the data corresponding to the code words based on the storage locations of the respective symbols included in the managed code word. The memory I/F 22 performs reading based on the command and stores the read data, namely, the received term corresponding to the code word to the data buffer 25. The DECODER 242 decodes the code word written on the data buffer 25.

This embodiment describes the count of channels as eight. However, the count of channels is not limited to this. It is only necessary that the count of channels is one or more. In the case of the count of channels of four, for example, the count of symbols included in one code word is eight for one channel, doubling the case where the count of channels is eight. In view of this, for example, it is only necessary to repeat the writing of the code words A, B, C, and D to p10 in units of two pages four times, that is, it is necessary to meet $N_c=4$ in the flowchart of FIG. 10. Similarly, in the case of the count of channels of two, it is only necessary to meet $N_c=8$.

As described above, to store the code word formed of 128 symbols that can erasure correct two symbols in the non-volatile memory 3 including the memory cells of two bits/cell, this embodiment generates the eight code words at the same time and repeats the consecutive writing of the symbols of the one code word across two pages. In view of this, if the data across the adjacent two word lines in the four planes are lost, using a simple writing procedure while restraining the capacity of the data buffer 25 for temporarily storing the code word, the data can be restored in most cases.

Second Embodiment

The first embodiment describes the case where the count of Banks is one or in the case where even if the Banks are plural, one code word is not dispersedly arranged to the plurality of Banks. Meanwhile, this embodiment describes the case where one code word is distributed to the two Banks. The configuration of the storage device 1 of this embodiment is similar to the first embodiment. However, this embodiment configures the count of Banks to two and the one code word is dispersedly arranged to the plurality of Banks.

To distribute the one code word to two Banks, the count of symbols of one code word per plane is two. FIG. 12 is a drawing illustrating an exemplary method for arranging the code words to dispersedly arrange one code word to two Banks. As illustrated in FIG. 12, the writing to the group g1 in each plane is similar to the examples of FIG. 8 and FIG. 9. When dispersedly arranging the one code word to the two Banks, the writing to the group g1 terminates the writing of the eight code words of the code words A, B, C, D, E, F, G, and H. In view of this, to the group g2, other eight code words (denoted as code words A', B', C', D', E', F', G', and H' in FIG. 12) are written in the similar order.

The procedure of writing of this embodiment is the procedure of setting $N_c=1$ in the procedure illustrated in FIG. 10. Accordingly, in this embodiment as well, when storing the code word formed of 128 symbols where the erasure of two symbols can be corrected to the non-volatile memory 3 including the memory cells of two bits/cell, it is only necessary that the eight code words are generated at the same time and the symbols of one code word are repeatedly written to two pages consecutively. In view of this, if the data across the adjacent two word lines in the four planes are lost, using a simple writing procedure while restraining the capacity of the data buffer 25 for temporarily storing the code word, the data can be restored in most cases.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory that includes four planes configured to be operable in a parallel, the plane including a plurality of word lines, each of the plurality of word lines being coupled to a plurality of memory cells, each of the plurality of the memory cells being capable of storing two bits of a first bit and a second bit, the first bit corresponding to a first page, the second bit corresponding to a second page;
   a memory interface configured to control reading and writing of data to the non-volatile memory;
   an encoder configured to generate eight code words; and
   a control unit configured to cause the memory interface to perform a first writing, a second writing after the first writing, and a fifth writing after the second writing, the fifth writing being configured to repeatedly perform a third writing and a fourth writing in sequence, wherein
   the first writing is configured to write a symbol included in one code word among the eight code words to the first page in a first word line among the plurality of word lines,
   the second writing is configured to write a symbol included in a code word identical to the code word used for the first writing to the first page in a word line adjacent to the first word line, the symbol being a symbol different from the symbol written by the first writing,
   the third writing is configured to write a symbol included in a code word different from a code word used for a writing performed immediately before among the first or the fourth writing to the second page in a word line on which writing to the first page has been executed oldest among word lines to which the second page has not been written, and
   the fourth writing is configured to write a symbol included in a code word identical to the code word used for the third writing to the first page in a word line adjacent to the word line adjacent to a word line in the third writing, the symbol being a symbol different from the symbol for the third writing, the word line being a word line to which data has not been written.

2. The memory system according to claim 1, wherein the code word has 128 symbols, the code word being a code word where an erasure of two symbols among the 128 symbols is able to be corrected.

3. The memory system according to claim 2, wherein
the writing control unit is configured to write the first to
fourth code words among the eight code words to a first
plane and a second plane among the four planes, and to
write the fifth to eighth code words among the eight
code words to a third plane and a fourth plane among
the four planes.

4. The memory system according to claim 3, wherein
in writing to the first and second planes, the writing
control unit is configured to
use the first code word in the first writing,
use the second code word in (4n+1)th third writing (n
indicates an integer of 0 or more),
use the third code word in a (4n+2)th third writing,
use the fourth code word in a (4n+3)th third writing,
and
use the first code word in a (4n+4)th third writing.

5. The memory system according to claim 4, wherein
the writing to the first and second planes, the writing
control unit is configured to
use a first symbol of the first code word in the first
writing,
use a (n+1) symbol of the second code word in a
(4n+1)th third writing,
use a (n+1) symbol of the third code word in a (4n+2)th
third writing,
use a (n+1) symbol of the fourth code word in a
(4n+3)th third writing, and
use a (n+2) symbol of the first code word in a (4n+4)th
third writing.

6. The memory system according to claim 2, wherein
in writing to the first and second planes, the writing
control unit is configured to
use the first code word in the first writing,
use the second code word in a (8n+1)th third writing (n
indicates an integer of 0 or more),
use the third code word in a (8n+2)th third writing,
use the fourth code word in a (8n+3)th third writing,
use the fifth code word in a (8n+4)th third writing,
use the sixth code word in a (8n+5)th third writing,
use the seventh code word in a (8n+6)th third writing,
use the eighth code word in a (8n+7)th third writing,
and
use the first code word in a (8n+8)th third writing.

7. The memory system according to claim 2, wherein
the non-volatile memory includes eight channel elements,
the channel elements each including the four planes,
a count of symbols included in one code word per plane
in the one channel element is eight,
the writing control unit is configured to write the first to
fourth code words among the eight code words to a first
plane and a second plane among the four planes, and
write the fifth to eighth code words among the eight
code words to a third plane and a fourth plane among
the four planes.

8. The memory system according to claim 2, wherein
the non-volatile memory includes eight channel elements,
the channel elements each including the four planes,
each of the eight channel elements includes two bank
elements corresponding to two banks,
a count of symbols included in one code word per plane
in the one channel element in one bank is four, and
the writing control unit is configured to write the first to
fourth code words among the eight code words to a first
plane and a second plane among the four planes, and
write code words other than fifth to eighth code words
among the eight code words to a third plane and a
fourth plane among the four planes.

9. The memory system according to claim 2, wherein
the code word is generated by Reed Solomon coding.

10. A memory system comprising:
a non-volatile memory that includes four planes from a
first to a fourth, the planes being configured to be
operable in a parallel, the plane including a plurality of
word lines, each of the plurality of word lines being
coupled to a plurality of memory cells, each of the
plurality of the memory cells being capable of storing
two bits of a first bit and a second bit, the first bit
corresponding to a first page, the second bit corresponding to a second page;
a memory interface configured to control reading and
writing of data to the non-volatile memory;
an encoder configured to generate eight code words from
a first to an eighth; and
a writing control unit configured to cause the memory
interface to:
write a first symbol included in the first code word to
a second page in a first word line, the first word line
being one of the plurality of word lines in the first
plane and the second plane, and write a second
symbol included in the first code word to a first page
in a third word line adjacent to a second word line
adjacent to the first word line after the writing of the
first symbol included in the first code word;
write a first symbol included in the second code word
to a second page in the second word line after the
writing of the second symbol included in the first
code word, and write a second symbol included in
the second code word to a first page in a fourth word
line adjacent to the third word line after the writing
of the first symbol included in the second code word;
write a first symbol included in the third code word to
a second page in the third word line after the writing
of the second symbol included in the second code
word, and write a second symbol included in the
third code word to a first page in a fifth word line
adjacent to the fourth word line after the writing of
the first symbol included in the third code word;
write a first symbol included in the fourth code word to
a second page in the fourth word line after the
writing of the second symbol included in the third
code word, and write a second symbol included in
the fourth code word to a first page in a sixth word
line adjacent to the fifth word line after the writing of
the first symbol included in the fourth code word;
write a first symbol included in the fifth code word to
a second page in a seventh word line, the seventh
word line being one of the plurality of word lines in
the third plane and the fourth plane, and write a
second symbol included in the fifth code word to a
first page in a ninth word line adjacent to an eighth
word line adjacent to the seventh word line after the
writing of the first symbol included in the fifth code
word;
write a first symbol included in the sixth code word to
a second page in the eighth word line after the
writing of the second symbol included in the fifth
code word, and write a second symbol included in
the sixth code word to a first page in a tenth word line
adjacent to the ninth word line after the writing of the
first symbol included in the sixth code word;
write a first symbol included in the seventh code word
to a second page in the ninth word line after the writing of the second symbol included in the sixth code word, and write a second symbol included in the seventh code word to a first page in an eleventh word line adjacent to the tenth word line after the writing of the first symbol included in the seventh code word; and write a first symbol included in the eighth code word to a second page in the tenth word line after the writing of the second symbol included in the seventh code word, and write a second symbol included in the eighth code word to a first page in a twelfth word line adjacent to the eleventh word line after the writing of the first symbol included in the eighth code word.

11. A method of controlling a non-volatile memory, the non-volatile memory including four planes configured to be operable in a parallel, the plane including a plurality of word lines, each of the plurality of word lines being coupled to a plurality of memory cells, each of the plurality of the memory cells being capable of storing two bits of a first bit and a second bit, the first bit corresponding to a first page, the second bit corresponding to a second page, the method comprising:

generating eight code words;

performing a first writing, the first writing being configured to write a symbol included in one code word among the eight code words to the second page in a first word line among the plurality of word lines;

performing a second writing after the first writing, the second writing being configured to write a symbol included in a code word identical to the code word used for the first writing to the second page in a word line adjacent to the first word line, the symbol being a symbol different from the symbol in the first writing; and performing and a fifth writing after the second writing, the fifth writing being configured to repeatedly perform a third writing and a fourth writing in sequence, the third writing being configured to write a symbol included in a code word different from a code word used for a writing performed immediately before among the first or the fourth writing to the first page in a word line on which writing to the second page has been executed oldest among word lines to which the first page has not been written, the fourth writing being configured to write a symbol included in a code word identical to the code word used for the third writing to the second page in a word line adjacent to the word line adjacent to the word line in the third writing, the symbol being a symbol different from the symbol for the third writing, the word line being a word line to which data has not been written.

12. The method according to claim 11, wherein the code word has 128 symbols, the code word being a code word where an erasure of two symbols among the 128 symbols is able to be corrected.

13. The method according to claim 12, wherein the method is configured to write the first to fourth code words among the eight code words to a first plane and a second plane among the four planes, and write the fifth to eighth code words among the eight code words to a third plane and a fourth plane among the four planes.

14. The method according to claim 13, wherein in writing to the first and second planes, the method is configured to use the first code word in the first writing, use the second code word in a (4n+1)th third writing (n indicates an integer of 0 or more), use the third code word in a (4n+2)th third writing, use the fourth code word in a (4n+3)th third writing, and use the first code word in a (4n+4)th third writing.

15. The method according to claim 14, wherein in the writing to the first and second planes, the method is configured to use a first symbol of the first code word in the first writing, use a (n+1) symbol of the second code word in a (4n+1)th third writing, use a (n+1) symbol of the third code word in a (4n+2)th third writing, use a (n+1) symbol of the fourth code word in a (4n+3)th third writing, and use a (n+2) symbol of the first code word in a (4n+4)th third writing.

16. The method according to claim 12, wherein in writing to the first and second planes, the method is configured to use the first code word in the first writing, use the second code word in a (8n+1)th third writing (n indicates an integer of 0 or more), use the third code word in a (8n+2)th third writing, use the fourth code word in a (8n+3)th third writing, use the fifth code word in a (8n+4)th third writing, use the sixth code word in a (8n+5)th third writing, use the seventh code word in a (8n+6)th third writing, use the eighth code word in a (8n+7)th third writing, and use the first, code word in a (8n+8)th third writing.

17. The method according to claim 12, wherein the non-volatile memory includes eight channel elements, the channel elements each including the four planes, a count of symbols includes in one code word per plane in the one channel element is eight, the method is configured to write the first to fourth code words among the eight code words to a first plane and a second plane among the four planes, and write the fifth to eighth code words among the eight code words to a third plane and a fourth plane among the four planes.

18. The method according to claim 12, wherein the non-volatile memory includes eight channel elements, the channel elements each including the four planes, each of the eight channel elements includes two bank elements corresponding to two banks, a count of symbols includes in one code word per plane in the one channel element in one bank is four, and the method is configured to write the first to fourth code words among the eight code words to a first plane and a second plane among the four planes, and write code words other than fifth to eighth code words among the eight code words to a third plane and a fourth plane among the four planes.

19. The method according to claim 12, wherein the code word is generated by Reed Solomon coding.

* * * * *